(12) United States Patent
Wu (10) Patent No.: US 9,064,552 B2
(45) Date of Patent: Jun. 23, 2015

(54) WORD LINE DRIVER AND RELATED METHOD

(71) Applicant: Taiwan Semiconductor Manufacturing Company, Ltd., Hsin-Chu (TW)

(72) Inventor: Jui-Jen Wu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 120 days.

(21) Appl. No.: 13/779,039

(22) Filed: Feb. 27, 2013

(65) Prior Publication Data

US 2014/0241101 A1    Aug. 28, 2014

(51) Int. Cl.
*G11C 11/00*    (2006.01)
*G11C 8/08*    (2006.01)

(52) U.S. Cl.
CPC ........................................ *G11C 8/08* (2013.01)

(58) Field of Classification Search
CPC ..................................... G11C 7/10; G11C 8/80
USPC ........................................ 365/230.06, 189.05
See application file for complete search history.

(56) References Cited

U.S. PATENT DOCUMENTS

| | | | |
|---|---|---|---|
| 5,703,827 A * | 12/1997 | Leung et al. | 365/230.06 |
| 6,157,216 A | 12/2000 | Lattimore et al. | |
| 7,498,637 B2 * | 3/2009 | Yamaoka et al. | 257/351 |
| 7,599,232 B2 * | 10/2009 | Miyata | 365/189.14 |
| 7,738,298 B2 * | 6/2010 | Chae et al. | 365/185.17 |
| 7,742,329 B2 | 6/2010 | Yoon et al. | |
| 8,072,834 B2 * | 12/2011 | Khamesra et al. | 365/230.06 |
| 8,369,180 B2 * | 2/2013 | Yu et al. | 365/230.06 |
| 8,456,904 B2 * | 6/2013 | Tran et al. | 365/175 |
| 8,599,618 B2 * | 12/2013 | Georgescu et al. | 365/185.18 |

FOREIGN PATENT DOCUMENTS

| | | |
|---|---|---|
| KR | 20010006988 | 1/2001 |
| KR | 20100106147 | 10/2010 |

OTHER PUBLICATIONS

Kim J. P. et al., "A 45nm Embedded STT-MRAM with design techniques to minimize read-disturbance," 2011 Symposium on VLSI Circuits Digest of Technical Papers, Jun. 15-17, 2011, pp. 296-297.

* cited by examiner

*Primary Examiner* — Michael Tran
(74) *Attorney, Agent, or Firm* — Slater & Matsil, L.L.P.

(57) ABSTRACT

A word line driver includes a first transistor electrically connected to a first voltage supply node and a word line, a second transistor electrically connected to a second voltage supply node and the word line, a first switch electrically connected to the first voltage supply node and a bulk electrode of the second transistor, and a second switch electrically connected to the second voltage supply node and the bulk electrode of the second transistor.

20 Claims, 9 Drawing Sheets

WORD LINE DRIVER AND RELATED METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node). As device dimensions shrink, voltage nodes also shrink, with modern core device voltages trending toward less than 1 Volt, and input/output (I/O) device voltages under 2 Volts.

Non-volatile memory (NVM), a type of memory that retains stored data while not powered, is often embedded in complementary metal-oxide-semiconductor (CMOS) logic processes, and typically requires high programming voltage for operation. In many NVM applications, a word line (WL) decoder drives high voltage on a word line for programming an NVM cell, and low voltage on the word line for reading from the NVM cell.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a word line driver circuit, and the like. Other embodiments may also be applied, however, to other types of memory circuits.

Throughout the various figures and discussion, like reference numbers refer to like components. Also, although singular components may be depicted throughout some of the figures, this is for simplicity of illustration and ease of discussion. A person having ordinary skill in the art will readily appreciate that such discussion and depiction can be and usually is applicable for many components within a structure.

Circuits are typically powered and/or biased by multiple voltages. The multiple voltages set up potential differences that allow electrical currents to flow throughout the circuit to perform various functions. Typically, electrical currents are defined as flowing from high voltage to low voltage. Voltage sources in circuits are also often defined in terms of a supply voltage and ground, with ground representing 0 Volts. Other definitions are sometimes given in terms of an upper supply voltage (VDD, VCC), and a lower supply voltage (VSS, VEE). Thus, a circuit that operates on a 1.8 Volt supply may be defined as having an upper bias of 0.9 Volts, and a lower bias of −0.9 Volts. In the following description, the term "ground" should be interpreted as including low supply voltage, such as the −0.9 Volts in the previous example, unless specifically referred to as "earth ground," or the like. Voltage levels, being relative, are not then intended so much to limit the scope of the disclosure, but more as a point of reference for convenient illustration.

Metal-oxide-semiconductor (MOS) transistors are typically described in terms of four transistor terminals: a gate, a source, a drain, and a bulk. It should be appreciated that most MOS transistors are symmetrical devices, such that the source and the drain thereof are interchangeable, and the terms "source" and "drain" often represent nomenclature for convenience of discussion. Terminals of MOS transistors may also be referred to as "electrodes," "ends," and the like, without any distinction necessarily intended through use of these different names. Biasing of such terminals is usually performed through direct or indirect contact between a direct current (DC) voltage source and the terminal being biased. The contact may be through metallization layers, contact vias, pads, bumps, and/or similar interconnect structures formed on and over device regions of the MOS transistors.

Non-volatile memory circuits, which include flash and floating gate types among others, are designed to store data by assuming a state (e.g., a certain electric charge) that is not affected by loss of power to the non-volatile memory circuit. In many applications, a word line decoder (or "word line driver") drives high voltage on a word line to program a non-volatile memory cell, and drives a low voltage on the word line to read the non-volatile memory cell. The word line driver employs a high voltage device to tolerate high voltage. However, the high voltage device may degrade read operation performance at low voltage due to high threshold voltage (Vth) of the high voltage device.

In the following disclosure, a novel word line driver architecture with dual voltage operation is introduced. The word line driver uses a switching scheme and negative pumping to improve read performance (e.g., speed) while maintaining program performance. The word line driver also has improved area.

Figure 1:
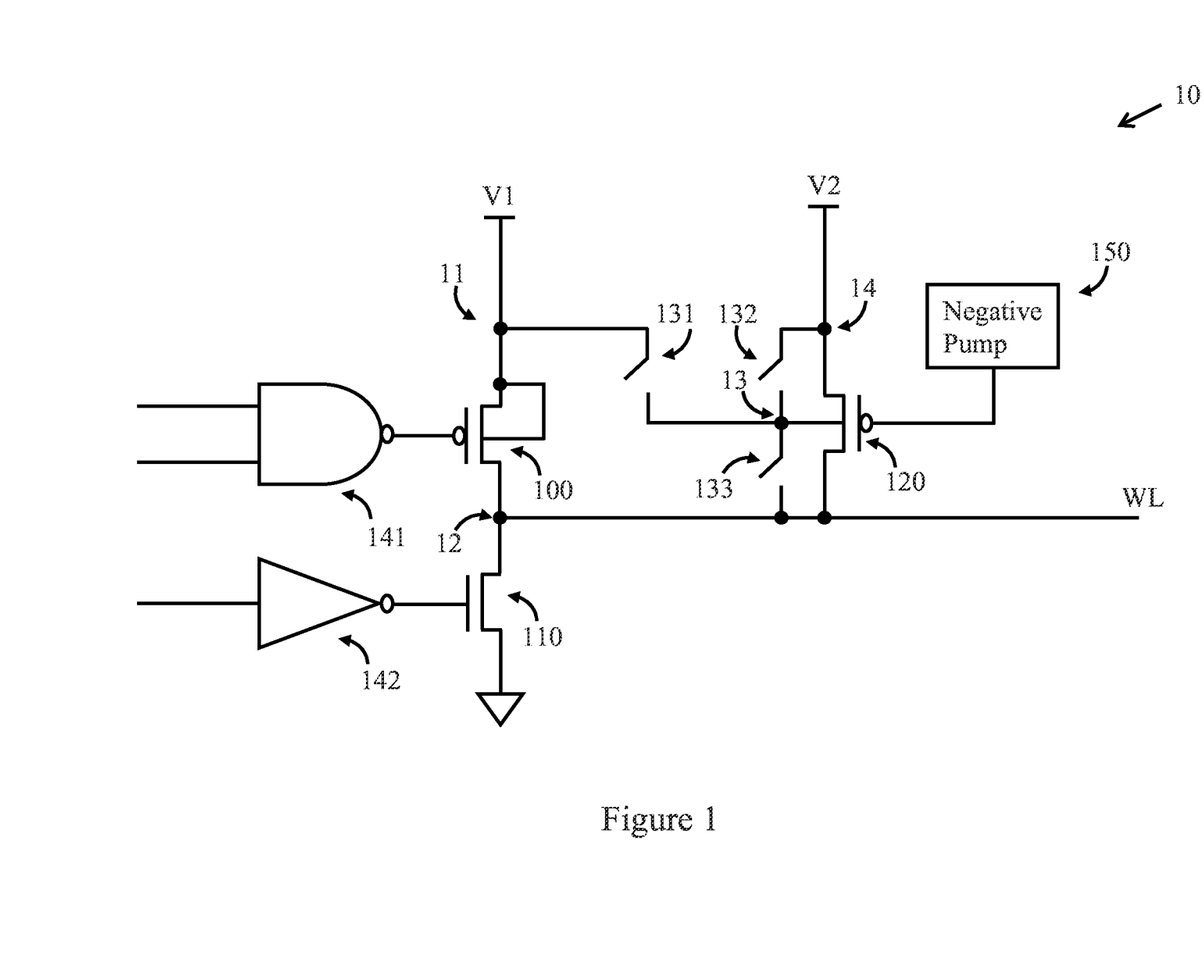
FIGS. 1 to 4 are circuit diagrams of a word line driver in accordance with various embodiments of the present disclosure.

FIG. 1 is a circuit diagram of a word line driver 10 in accordance with various embodiments of the present disclosure. The word line driver 10 includes transistors 100, 110, and 120, logic gates 141, 142, switches 131-133, and a negative pumping circuit 150. Internal connections of the word line driver 10 are made at various circuit nodes 11, 12, 13, 14. In some embodiments, the switches 131-133 are transistors, transmission gates, or the like.

The logic gate 142, which is an inverter in some embodiments, and the transistor 110 function to pull voltage on a word line (WL) down to a low voltage (e.g., ground). The transistor 110 is an N-type MOS (NMOS) transistor in some embodiments. A gate electrode of the transistor 110 is electrically connected to an output terminal of the logic gate 142. A source electrode of the transistor 110 is electrically connected to ground, and a drain electrode of the transistor 110 is electrically connected to the word line (e.g., at the node 12). In some embodiments, the transistor 110 is a high voltage device, which is capable of operating in a high voltage environment, such as 5 Volts or greater.

The logic gate 141, which is a NAND gate in some embodiments, operates to control voltage at a gate electrode of the transistor 100. The transistor 100 is a P-type MOS (PMOS) transistor in some embodiments. A source electrode of the transistor 100 is electrically connected to a first voltage source (e.g., at the node 11), which supplies a first voltage V1. A drain electrode of the transistor 100 is electrically connected to the word line (e.g., at the node 12). When the logic gate 141 outputs a logic signal at a voltage lower than the first voltage V1, the transistor 100 turns on, which pulls up the voltage on the word line to about the first voltage V1. In some embodiments, the transistor 100 is a high voltage device, which is capable of operating in a high voltage environment, such as 5 Volts or greater.

The transistor 120 is a PMOS transistor in some embodiments. A source electrode of the transistor 120 is electrically connected to a second voltage source (e.g., at the node 14), which supplies a second voltage V2. In some embodiments, the second voltage V2 is lower than the first voltage V1. In some embodiments, the first voltage V1 is about 5 Volts, and the second voltage V2 is about 3 Volts. A drain electrode of the transistor 120 is electrically connected to the word line (e.g., at the node 12). In some embodiments, the transistor 120 is a high voltage device, which is capable of operating in a high voltage environment, such as 5 Volts or greater.

Electrical connection of a bulk electrode of the transistor 120 is controlled by any of the three switches 131, 132, 133. The node 13 is electrically connected to the bulk electrode of the transistor 120. The switch 131 has a first terminal electrically connected to the bulk electrode at the node 13, and a second terminal electrically connected to the first voltage source at the node 11. The switch 132 has a first terminal electrically connected to the bulk electrode at the node 13, and a second terminal electrically connected to the second voltage source at the node 14. The switch 133 has a first terminal electrically connected to the bulk electrode at the node 13, and a second terminal electrically connected to the word line at the node 12.

Functionally, the switch 131 when turned on (closed) establishes a path between the first voltage source and the bulk electrode of the transistor 120, which pulls voltage at the bulk electrode of the transistor 120 to the first voltage V1. The switch 132 when turned on (closed) establishes a path between the second voltage source and the bulk electrode of the transistor 120, which pulls voltage at the bulk electrode of the transistor 120 to the second voltage V2. The switch 133 when turned on (closed) establishes a path between the word line and the bulk electrode of the transistor 120, which pulls voltage at the bulk electrode of the transistor 120 to the voltage on the word line.

Figure 2:
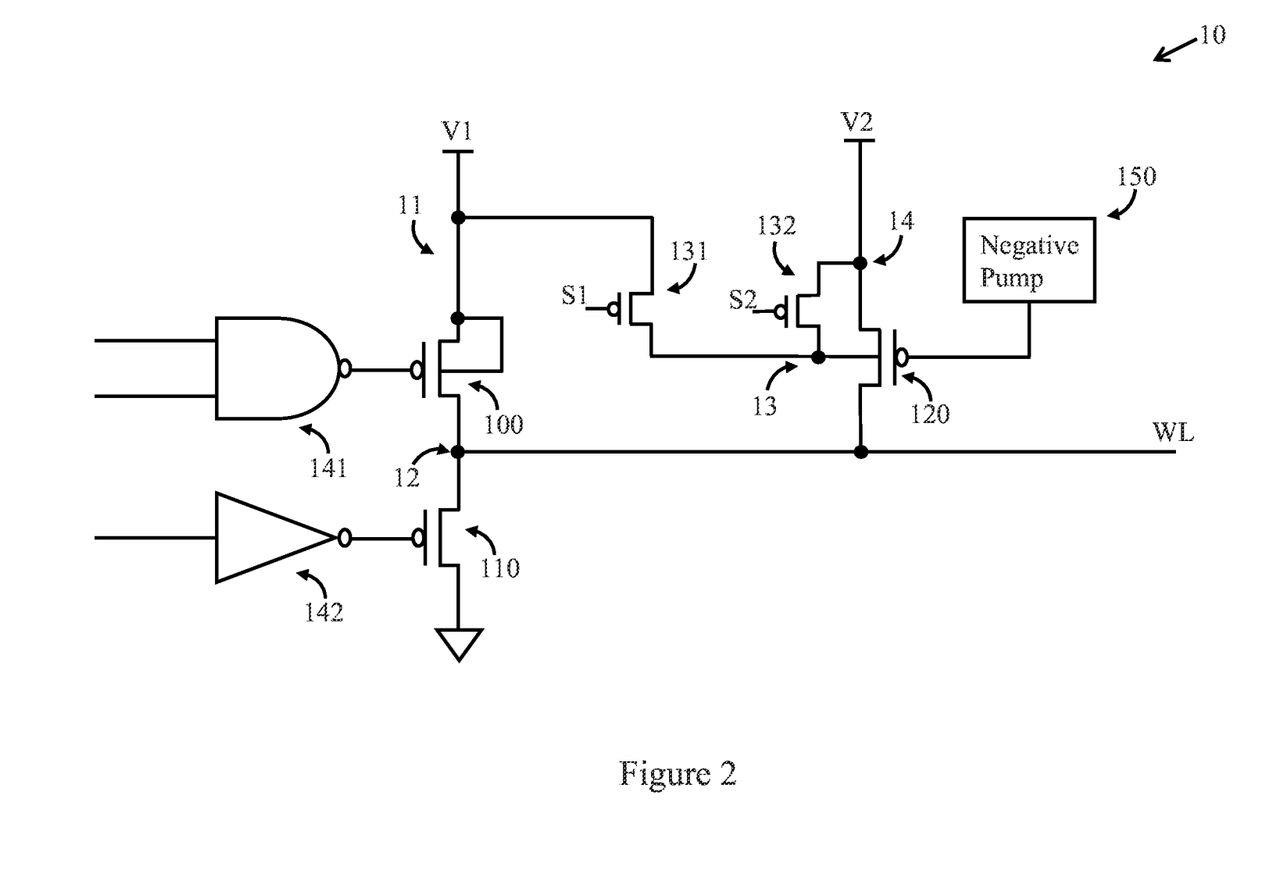

FIG. 2 is a circuit diagram of the word line driver 10 in accordance with various embodiments of the present disclosure. In the configuration shown in FIG. 2, the word line driver 10 does not include the switch 133. As shown, the switch 131 is a PMOS transistor in some embodiments. A source electrode of the switch 131 is electrically connected to the first voltage source at the node 11. A drain electrode of the switch 131 is electrically connected to the bulk electrode of the transistor 120 at the node 13. A gate electrode of the switch 131 receives a first control signal S1 for controlling operation of the switch 131. When the first control signal S1 is a voltage lower than the first voltage V1, the switch 131 conducts to establish the path between the first voltage source and the bulk electrode of the transistor 120.

The switch 132 is a PMOS transistor in some embodiments. A source electrode of the switch 132 is electrically connected to the second voltage source at the node 14. A drain electrode of the switch 132 is electrically connected to the bulk electrode of the transistor 120 at the node 13. A gate electrode of the switch 132 receives a second control signal S2 for controlling operation of the switch 132. When the second control signal S2 is a voltage lower than the second voltage V2, the switch 132 conducts to establish the path between the second voltage source and the bulk electrode of the transistor 120. The second control signal S2 is a logic-inverted signal of the first control signal S1 in some embodiments. In some embodiments, the second control signal S2 is generated independently of the first control signal S1. In some embodiments, low logic periods of the first control signal S1 and the second control signal S2 are non-overlapping.

In some embodiments, during non-read periods, the transistor 120 is turned off, and the first control signal S1 is asserted (low voltage) to turn on the switch 131, which pulls the bulk electrode of the transistor 120 to the first voltage V1, and sets up a positive bulk-source voltage $V_{BS}$ on the transistor 120, increasing threshold voltage $V_{TH}$ of the transistor 120 through the body effect. The increased threshold voltage $V_{TH}$ allows the transistor 120 to be kept turned off more easily when not in use, such as in the non-read periods.

During read periods, lower voltage is applied to the word line than would be provided during a programming operation. For example, the second voltage V2 is transferred to the word line through the transistor 120 as charges flow from the second voltage source to a load on the word line. Rate of flow of the charges is largely determined by overdrive voltage of the transistor 120, which is the difference between the source-gate voltage $V_{SG}$ and the threshold voltage $V_{TH}$ of the transistor 120. The threshold voltage $V_{TH}$ is affected by the body effect, which is determined at least partly by bulk-source voltage $V_{BS}$. With source voltage determined by the second voltage source, two voltages can be adjusted by the designer: the gate voltage, and the threshold voltage. In the case of a PMOS transistor, such as the transistor 120, lowering the gate voltage increases the source-gate voltage $V_{SG}$, and lowering the bulk-source voltage $V_{BS}$ lowers the threshold voltage $V_{TH}$, both of which contribute to better driving capability, which improves rise time.

As shown in FIG. 2, the switch 132 acts to short the source and bulk electrodes of the transistor 120 when turned on, effectively eliminating the body effect ($V_{BS}$=0 Volts), and thereby lowering the threshold voltage of the transistor 120. The negative pump 150 acts to pull down the gate voltage at the gate electrode of the transistor 120, which increases the source-gate voltage $V_{SG}$, and increases current output of the transistor 120. Both of these actions serve to shorten rise time of the word line voltage, which can improve read speed. It should be noted that the negative pump 150 is optional, and is omitted in some embodiments at least to save area.

Figure 3:
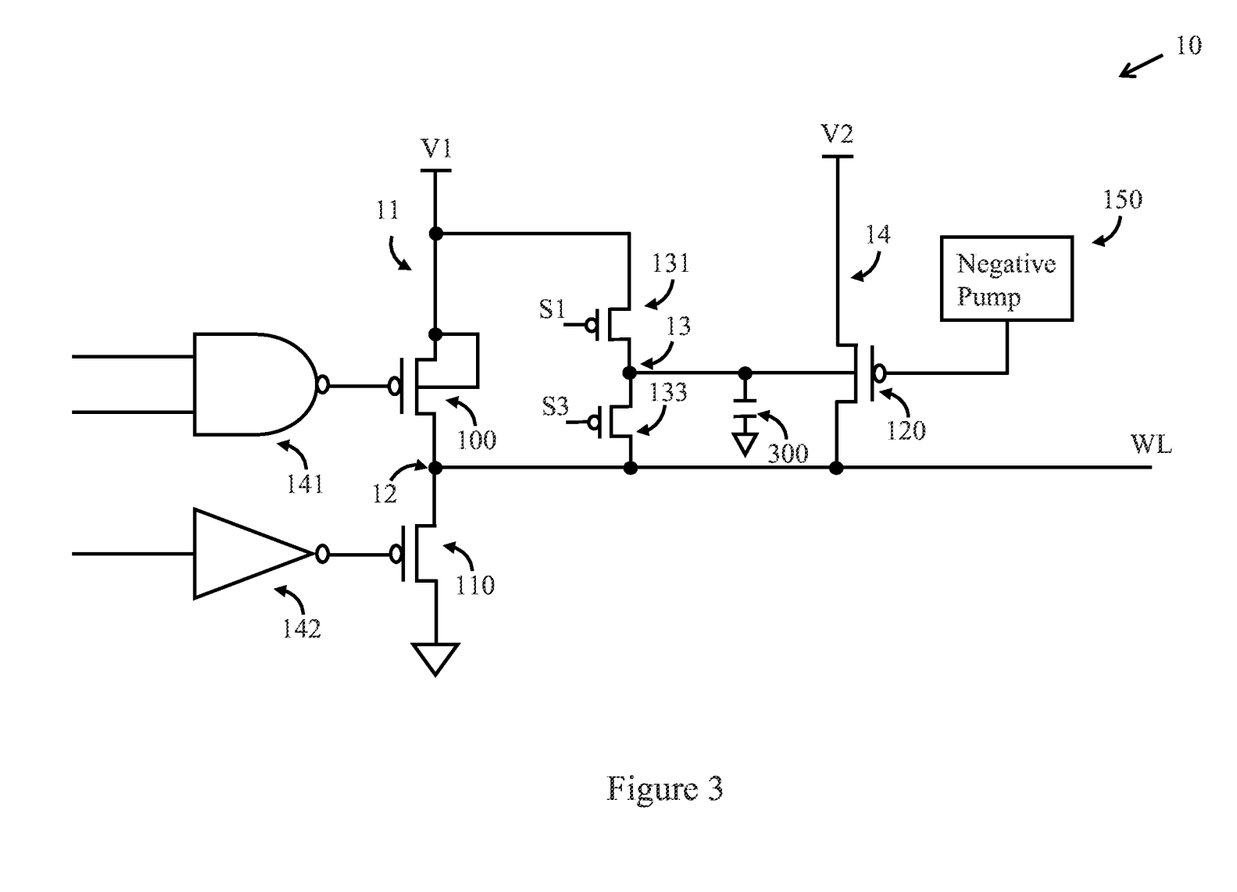

FIG. 3 is a circuit diagram of the word line driver 10 in accordance with various embodiments of the present disclosure. In the configuration shown in FIG. 3, the word line driver 10 does not include the switch 132. As shown, the switch 131 is a PMOS transistor in some embodiments. A source electrode of the switch 131 is electrically connected to the first voltage source at the node 11. A drain electrode of the switch 131 is electrically connected to the bulk electrode of the transistor 120 at the node 13. A gate electrode of the switch 131 receives a first control signal S1 for controlling operation of the switch 131. When the first control signal S1 is a voltage lower than the first voltage V1, the switch 131 conducts to establish the path between the first voltage source and the bulk electrode of the transistor 120.

The switch 133 is a PMOS transistor in some embodiments. A source electrode of the switch 133 is electrically connected to the word line at the node 12. A drain electrode of the switch 133 is electrically connected to the bulk electrode of the transistor 120 at the node 13. A gate electrode of the switch 133 receives a third control signal S3 for controlling operation of the switch 132. When the third control signal S3 is at a logic low voltage lower than the bulk voltage, the switch 133 conducts to establish the path between the word line and the bulk electrode of the transistor 120. The third control signal S3 is a logic-inverted signal of the first control signal S1 in some embodiments. In some embodiments, the third control signal S3 is generated independently of the first control signal S1. In some embodiments, low logic periods of the first control signal S1 and the third control signal S3 are non-overlapping.

In some embodiments, the switch 133 is an NMOS transistor ("the NMOS switch 133"), and the gate electrode of the switch 133 is electrically connected to the gate electrode of the transistor 131, such that the switches 131 and 133 are both controlled by the first control signal S1. In some embodiments, the gate electrode of the NMOS switch 133 is controlled by the third control signal S3. In some embodiments, the third control signal S3 is a logic-inverted signal of the first control signal S1 in some embodiments. In some embodiments, the third control signal S3 is generated independently of the first control signal S1. In some embodiments, low logic periods of the first control signal S1 and the third control signal S3 are non-overlapping.

In some embodiments, during non-read periods, the transistor 120 is turned off, and the first control signal S1 is asserted (low voltage) to turn on the switch 131, which pulls the bulk electrode of the transistor 120 to the first voltage V1, and sets up a positive bulk-source voltage $V_{BS}$ on the transistor 120, increasing threshold voltage $V_{TH}$ of the transistor 120 through the body effect. The increased threshold voltage $V_{TH}$ allows the transistor 120 to be kept turned off more easily when not in use, such as in the non-read periods.

The transistor 120 is formed in an N-type well (N-well) in some embodiments. The N-well establishes a parasitic N-well capacitor 300 at the bulk electrode of the transistor 120. The N-well capacitor 300 is charged to the first voltage V1 during the non-read periods. As shown in FIG. 3, when the switch 133 is turned on (closed) during the read period, the bulk electrode of the transistor 120 is electrically connected to the word line, which sets up charge sharing between the top plate of the N-well capacitor 300 and the word line. The charge sharing acts to rapidly pull up the word line voltage. The negative pump 150 acts to pull down the gate voltage at the gate electrode of the transistor 120, which increases the source-gate voltage $V_{SG}$, and increases current output of the transistor 120. Both of these actions serve to shorten rise time of the word line voltage, which can improve read speed. It should be noted that the negative pump 150 is optional, and is omitted in some embodiments at least to save area.

Figure 4:
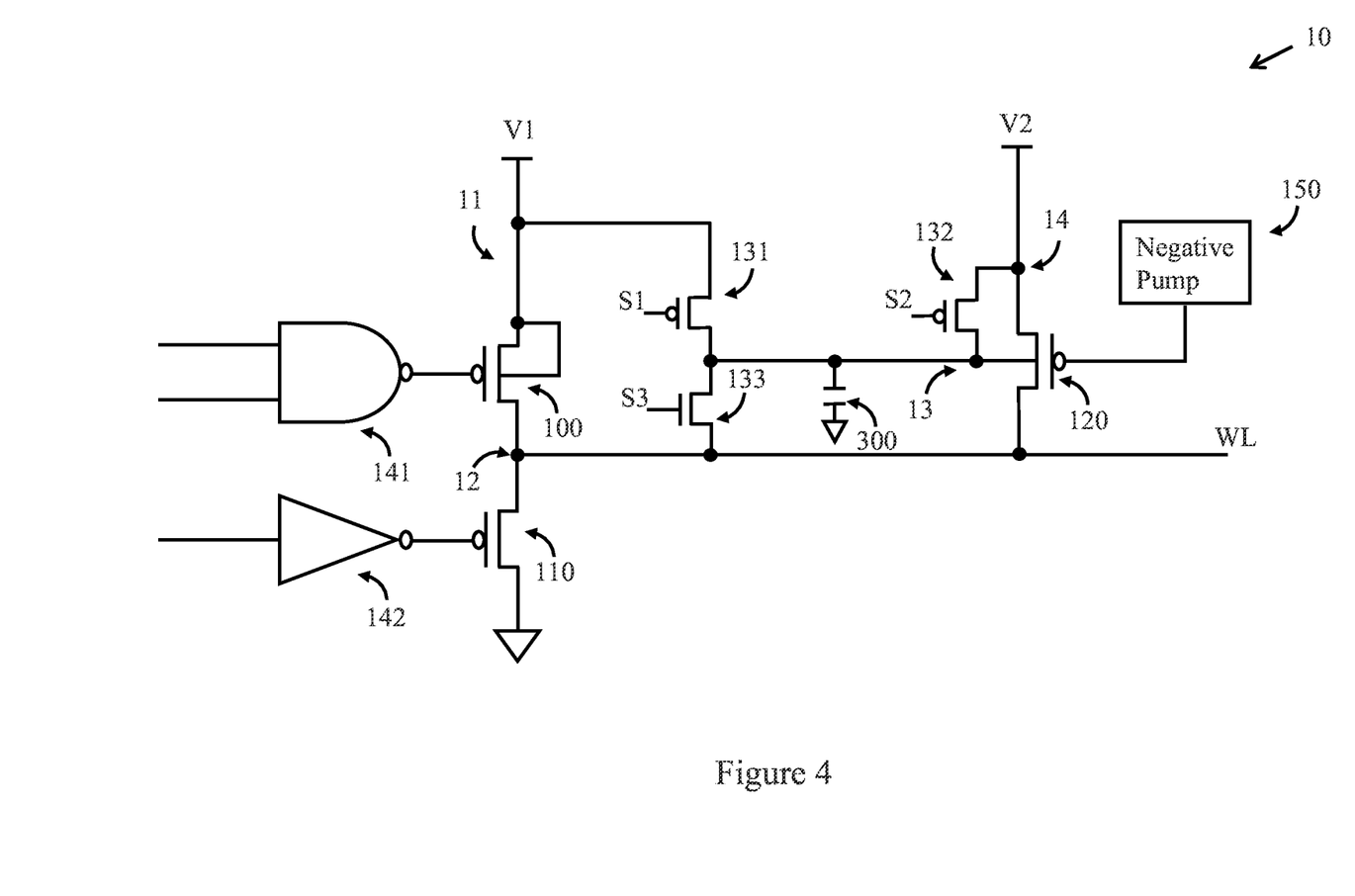

FIG. 4 is a circuit diagram of the word line driver 10 in accordance with various embodiments of the present disclosure. In the configuration shown in FIG. 4, all three of the switches 131, 132, 133 are utilized. The switches 131, 132, 133 are controlled by the first, second, and third control signals S1, S2, S3. The switch 131 acts to increase the bulk-source voltage $V_{BS}$ and charge the N-well capacitor 300 in non-read periods, as described above. The switch 133 acts to set up the charge sharing between the top plate of the N-well capacitor 300 and the word line as described above. The switch 132 acts to short together the bulk electrode and the source electrode of the transistor 120 to eliminate the body effect and lower the threshold voltage $V_{TH}$ of the transistor 120.

Figure 5:
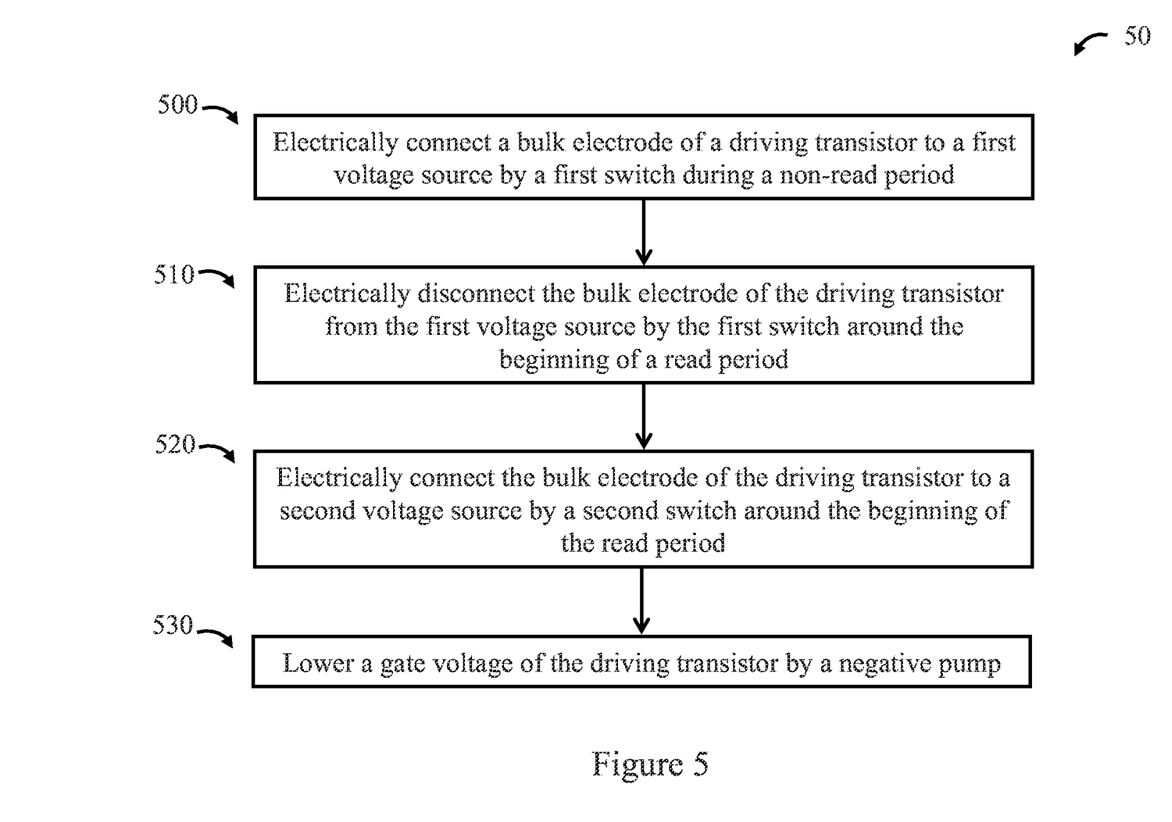
FIGS. 5 to 7 are flowcharts of methods of driving a word line in accordance with various embodiments of the present disclosure.

FIG. 5 is a flowchart of a method 50 of driving a word line in accordance with various embodiments of the present disclosure. In some embodiments, the method 50 is used to operate the word line driver 10 shown in FIG. 2. In step 500 of the method 50, a bulk electrode of a driving transistor, such as the bulk electrode of the transistor 120, is electrically connected to the first voltage source by the switch 131 during a non-read period, such as a program period or a standby period. In some embodiments, prior to a read period, the bulk electrode of the transistor 120 is electrically disconnected from the first voltage source by the switch 131 (step 510). In some embodiments, the bulk electrode of the transistor 120 is electrically disconnected from the first voltage source by the switch 131 as the read period begins or after the beginning of the read period. Simultaneous with, or following, step 510, the bulk electrode of the transistor 120 is electrically connected to the second voltage source by the switch 132 (step 520) to short the bulk electrode to the source electrode of the transistor 120, and eliminate the body effect. In some embodiments, step 530 is performed to lower the gate voltage at the gate electrode of the transistor 120 by the negative pump 150. In some embodiments, the gate voltage is lowered by applying a fixed bias voltage (no negative pumping) to the gate electrode of the transistor 120. With the gate voltage pulled low by step 530, the transistor 120 turns on to pull the word line voltage up to the read voltage, such as the second voltage V2.

Figure 6:
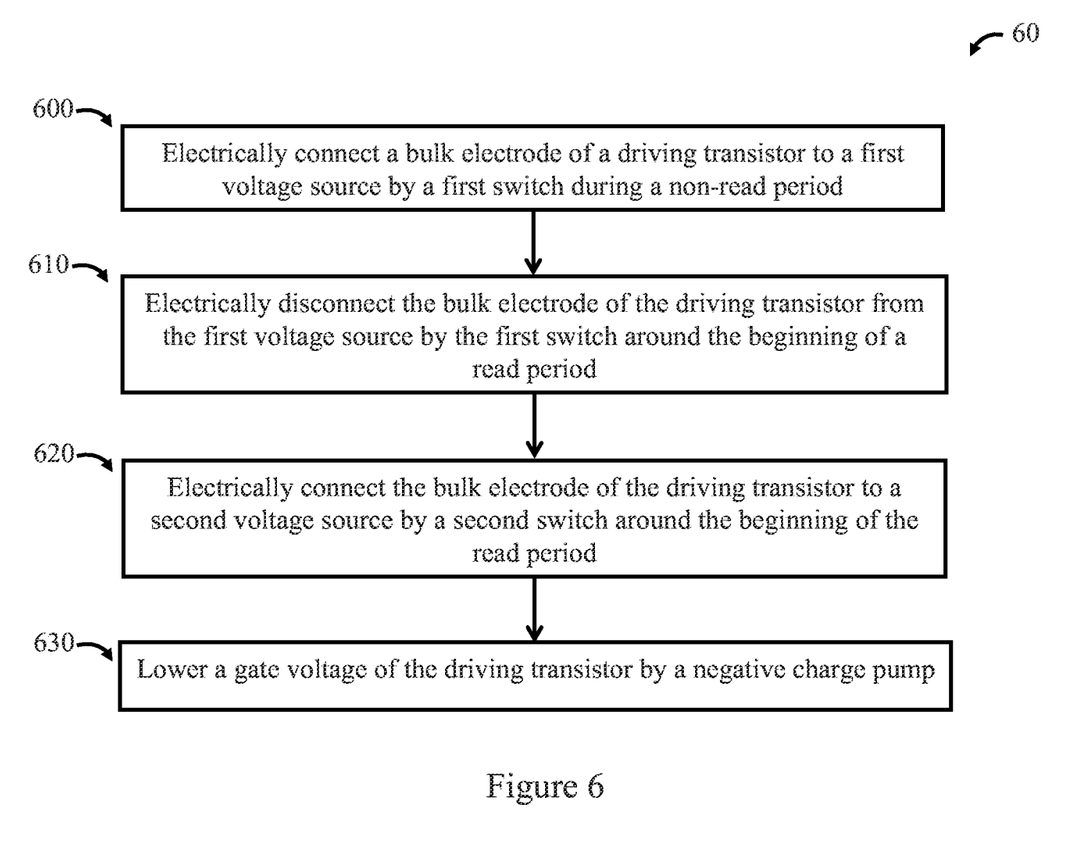

FIG. 6 is a flowchart of a method 60 of driving a word line in accordance with various embodiments of the present disclosure. In some embodiments, the method 60 is used to operate the word line driver 10 shown in FIG. 3. In step 600 of the method 60, a bulk electrode of a driving transistor, such as the bulk electrode of the transistor 120, is electrically connected to the first voltage source by the switch 131 during a non-read period, such as a program period or a standby period. In some embodiments, prior to a read period, the bulk electrode of the transistor 120 is electrically disconnected from the first voltage source by the switch 131 (step 610). In some embodiments, the bulk electrode of the transistor 120 is electrically disconnected from the first voltage source by the switch 131 as the read period begins or after the beginning of the read period. Simultaneous with, or following, step 610, the bulk electrode of the transistor 120 is electrically connected to the word line by the switch 133 (step 620) to set up the charge sharing between the top plate of the N-well capacitor 300 and the word line. In some embodiments, step 630 is performed to lower the gate voltage at the gate electrode of the transistor 120 by the negative pump 150. In some embodiments, the gate voltage is lowered by applying a fixed bias voltage (no negative pumping) to the gate electrode of the transistor 120. With the gate voltage pulled low by step 630, the transistor 120 turns on to pull the word line voltage up to the read voltage, such as the second voltage V2.

Figure 7:
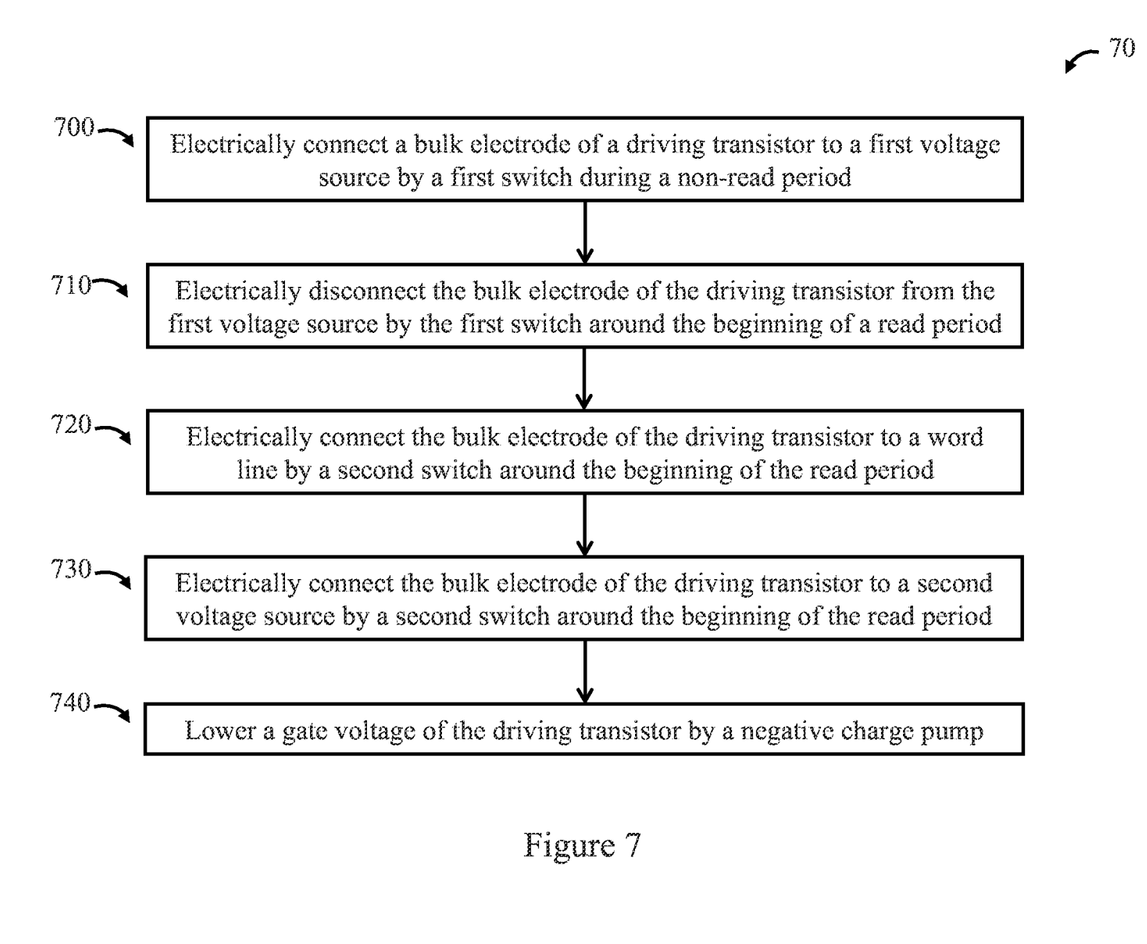

FIG. 7 is a flowchart of a method 70 of driving a word line in accordance with various embodiments of the present disclosure. In some embodiments, the method 70 is used to operate the word line driver 10 shown in FIG. 4. In step 700 of the method 70, a bulk electrode of a driving transistor, such as the bulk electrode of the transistor 120, is electrically connected to the first voltage source by the switch 131 during a non-read period, such as a program period or a standby period. In some embodiments, prior to a read period, the bulk electrode of the transistor 120 is electrically disconnected from the first voltage source by the switch 131 (step 710). In some embodiments, the bulk electrode of the transistor 120 is electrically disconnected from the first voltage source by the switch 131 as the read period begins or after the beginning of the read period. Simultaneous with, or following, step 610, the bulk electrode of the transistor 120 is electrically connected to the word line by the switch 133 (step 620) to set up the charge sharing between the top plate of the N-well capacitor 300 and the word line. Simultaneous with, or following, step 710, the bulk electrode of the transistor 120 is electrically connected to the second voltage source by the switch 132 (step 730) to short the bulk electrode to the source electrode of the transistor 120, and eliminate the body effect. In some embodiments, step 740 is performed to lower the gate voltage at the gate electrode of the transistor 120 by the negative pump 150. In some embodiments, the gate voltage is lowered by applying a fixed bias voltage (no negative pumping) to the gate electrode of the transistor 120. With the gate voltage pulled low by step 730, the transistor 120 turns on to pull the word line voltage up to the read voltage, such as the second voltage V2.

In the method 70, timing of steps 720, 730, and 740 may be configured to allow the charge sharing, the elimination of the body effect, and the negative pumping to improve the speed of pulling up the word line voltage. In some circuit configurations of the word line driver 10, the charge sharing from the N-well capacitor 300 to the word line will be adversely affected by shorting the bulk electrode to the second voltage source prior to or during the charge sharing. Thus, in some embodiments, step 720 is started and completed prior to starting step 730. In some embodiments, the third control signal S3 is a pulse that starts and ends prior to the upcoming falling edge of the second control signal S2. In some embodiments, a falling edge of the third control signal S3 and a rising edge of the second control signal S2 crisscross, corresponding to the steps 720 and 730 starting at nearly the same time. In some embodiments, pulse width of the second control signal S2 is shorter than pulse width of the third control signal S3, for example five to ten times shorter.

Figure 8:
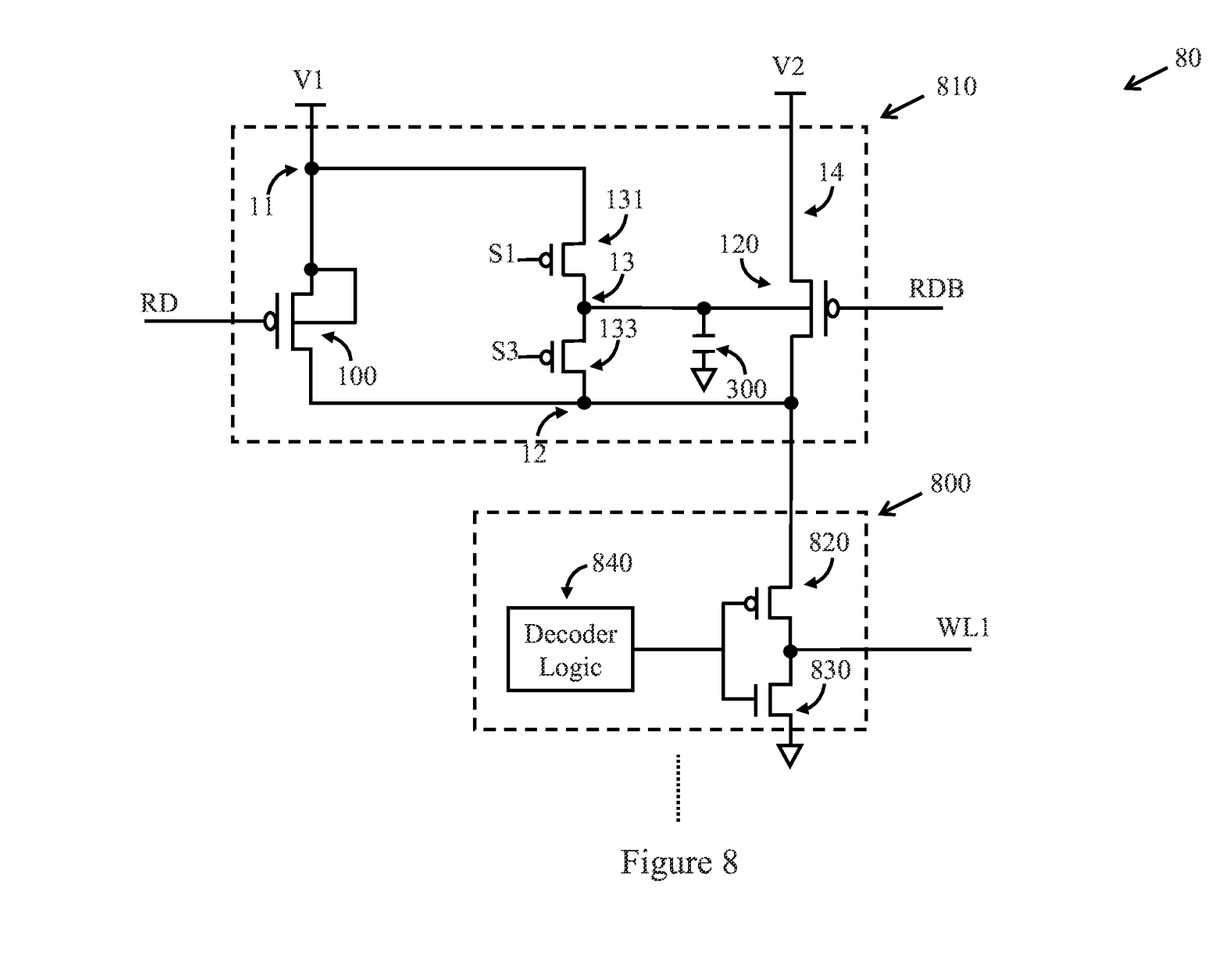
FIG. 8 is a circuit diagram of a word line driver stage with shared voltage switch in accordance with various embodiments of the present disclosure.

FIG. 8 is a circuit diagram of a word line driver array 80 with shared voltage switch 810 in accordance with various embodiments of the present disclosure. In some embodiments, the shared voltage switch 810 is similar to the word line driver 10 of FIGS. 1 to 4, and like reference numerals refer to like components. A word line driver stage 800 of the word line driver array 80 drives a word line WL1. An extensive number of word line driver stages similar to the word line driver stage 800 are included in the word line driver array 80, and the word line driver stages share the shared voltage switch 810. For example, the word line driver array 80 may include 1024 word line driver stages similar to the word line driver stage 800. Sharing the shared voltage switch 810 allows for simpler design of the word line driver stage 800, and saves area, while retaining the advantages of charge sharing and negative pumping.

Description of the word line driver stages is made with reference to the word line driver stage 800 shown in FIG. 8. Transistor 820 of the word line driver stage 800 is a PMOS transistor in some embodiments, and has a source electrode electrically connected to the drain electrode of the transistor 120. A drain electrode of the transistor 820 is electrically connected to the word line WL1. Transistor 830 is an NMOS transistor in some embodiments, and has a drain electrode electrically connected to the word line WL1. A source electrode of the transistor 830 is electrically connected to a low voltage source (e.g., ground). A gate electrode of the transistor 830 is electrically connected to a gate electrode of the transistor 820.

Decoder logic 840 of the word line driver stage 800 has an output electrically connected to the gate electrodes of the transistors 820, 830. The decoder logic 840 is configured to receive address signals, and output a low voltage signal (logic low) to the transistors 820, 830 to turn off the transistor 830, and pull up the word line voltage on the word line WL1 by turning on the transistor 820 when the address signals indicate that the word line driver stage 800 is to be activated.

When the word line driver stage 800 is activated, during a read period, a read signal RD at logic high voltage level is received at the transistor 100 of the shared voltage switch 810, and an inverted read signal RDB at logic low voltage level is received at the transistor 120 of the shared voltage switch 810. The read signal RD acts to turn off the transistor 100, cutting off high voltage of the first voltage source from the node 12. The read signal RDB acts to turn on the transistor 120, pulling up the voltage at the node 12 to the second voltage V2. In some embodiments, the gate electrode of the transistor 120 is electrically connected to a negative pump, such as the negative charge pump 150. Around the time the read signal RD and the inverted read signal RDB are received, the switch 131 is turned off by the first control signal S1, leaving the N-well capacitor 300 (node 13) charged at the first voltage V1. In some embodiments, after the switch 131 is turned off, the third switch 133 is turned on by the third control signal S3, initiating charge sharing from the node 13 to the node 12, which assists in pulling up the voltage of the node 12, which is transferred to the word line WL1 through the transistor 820. In some embodiments, the third switch 133 is turned on as the switch 131 is turned off.

Figure 9:
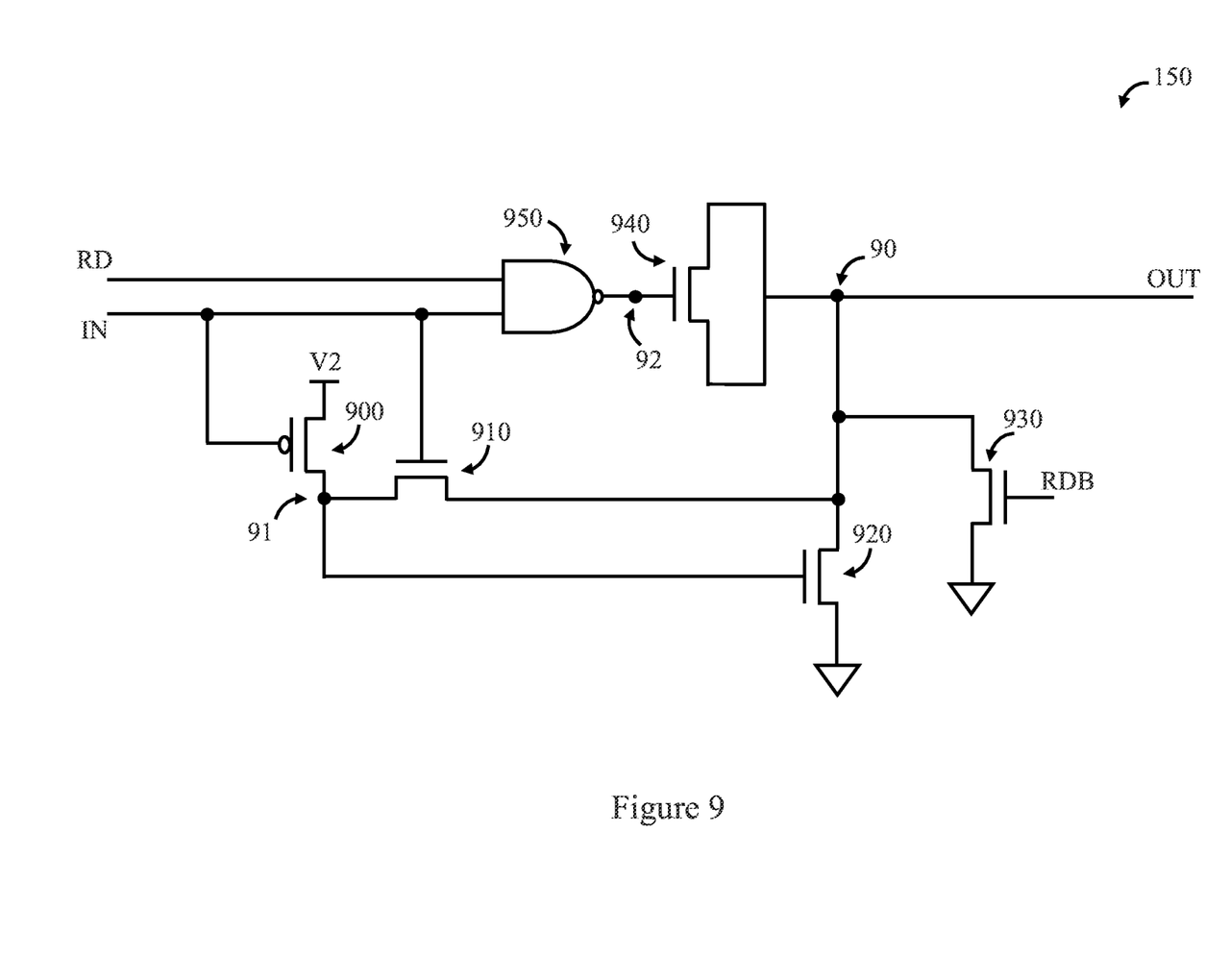
FIG. 9 is a circuit diagram of a negative pump in accordance with various embodiments of the present disclosure.

FIG. 9 is a circuit diagram of the negative pump 150 in accordance with various embodiments of the present disclosure. A logic gate 950, such as an inverter or a NAND gate (as shown in FIG. 9), receives an input pulse. The input pulse is generated in response to, as a result of, or directly from a decoder signal activating the word line WL (or the word line WL1) for a read operation. In some embodiments, the logic gate 950 is a NAND gate, and the logic gate 950 outputs low voltage (at node 92) when both input terminals of the logic gate 950 are biased at high voltage. In some embodiments, the logic gate 950 is an inverter, and the logic gate 950 outputs low voltage (at node 92) when the input terminal of the logic gate 950 is biased at high voltage, and high voltage when the input terminal is biased at low voltage. When voltage bias at the input terminal labeled "RD" is low (corresponding to a non-read period), voltage at the node 92 is pulled high by the logic gate 950.

A capacitor 940 has a top plate electrically connected to the node 92, and a bottom plate electrically connected to a node 90 corresponding to an output of the negative pump 150. In some embodiments, the capacitor 940 is a MOS capacitor. In some embodiments, the capacitor 940 is a metal-oxide-metal (MOM) capacitor, a metal-insulator-metal (MIM) capacitor, another type of integrated capacitor, or the like.

A transistor 930 is electrically connected to the capacitor 940 and ground to pull down voltage at the node 90 to ground (or another low voltage level) during non-read periods. In some embodiments, the transistor 930 is an NMOS transistor. A gate electrode of the transistor 930 receives an inverted read signal RDB. When the inverted read signal RDB is logic level high (corresponding to a non-read period), the transistor 930 is turned on, and charge can flow from a drain electrode of the transistor 930 (node 90) to a source electrode of the transistor 930 (ground). In read periods, the transistor 930 is turned off by the inverted read signal RDB.

Transistors 900, 910, and 920 form a path for improving performance of the negative pump 150. The transistors 910 and 920 are NMOS transistors in some embodiments, and the transistor 900 is a PMOS transistor in some embodiments. In non-read periods, and prior to receiving the input pulse, the second input terminal of the logic gate 950 (labeled "IN") is at a low voltage corresponding to logic low. With the low voltage at a gate electrode of the transistor 900, and the second voltage V2 at a source electrode of the transistor 900, the transistor 900 is turned on, which introduces the second voltage V2 at the node 91 corresponding to a gate electrode of the transistor 920. As a result, the transistor 920 is turned on in the non-read periods and prior to receiving the input pulse (in read periods).

When the input pulse arrives during a read period (RD=High), the negative pump 150 pulls down voltage at the node 90 corresponding to the output. In the word line driver 10, the output of the negative pump 150 corresponds to the gate electrode of the transistor 120. With the input terminal(s) of the logic gate 950 at logic high, the logic gate 950 pulls down the voltage at the node 92 to logic low (low voltage). As a result, the node 90 is pulled down from a low voltage (e.g., 0 Volts) to a lower voltage due to capacitive coupling of the capacitor 940. The transistor 910 turns on due to the high voltage present at a gate electrode of the transistor 910, and the transistor 900 turns off due to the high voltage at the gate electrode of the transistor 900 ($V_{SG}$=0 Volts). The lower voltage is transmitted through the transistor 910 to the gate electrode of the transistor 920, so that the transistor 920 is turned off ($V_{GS}$<0 Volts). Performance of the negative pump 150 is improved by the transistors 900, 910, and 920, which prevent the lower voltage from being pulled up by ground through the transistor 920.

Embodiments may provide advantages. The switches 131 and 132 of the word line driver 10 make the transistor 120 harder to turn on during non-read periods (switch 131), and easier to turn on during read periods (switch 132). The switch 133 induces the charge sharing to rapidly pull up the word line voltage. The negative pump 150 with improved performance described above acts to increase source-gate voltage of the transistor 120, which increases current throughput of the transistor 120, and speeds up rise time of the word line WL. As a result, the transistor 120 has improved word line speed for driving high voltage and low voltage on the word line WL. In low voltage operation, the PMOS threshold voltage is decreased, so the PMOS size can be reduced to save area.

In accordance with various embodiments of the present disclosure, a word line driver comprises a first transistor electrically connected to a first voltage supply node and a word line, a second transistor electrically connected to a second voltage supply node and the word line, a first switch electrically connected to the first voltage supply node and a bulk electrode of the second transistor, and a second switch electrically connected to the second voltage supply node and the bulk electrode of the second transistor.

In accordance with various embodiments of the present disclosure, a word line driver comprises a first transistor electrically connected to a first voltage supply node and a word line, a second transistor electrically connected to a second voltage supply node and the word line, a first switch electrically connected to the first voltage supply node and a bulk electrode of the second transistor, and a second switch electrically connected to the bulk electrode of the second transistor and the word line.

In accordance with various embodiments of the present disclosure, a method of driving a word line comprises providing a first transistor electrically connected to a first voltage source and the word line, providing a second transistor electrically connected to a second voltage source and the word line, electrically connecting a bulk electrode of the second transistor to the first voltage source during a non-read period, and electrically connecting the bulk electrode of the second transistor to the second voltage source around a beginning of a read period.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A word line driver comprising:
   a first transistor electrically connected to a first voltage supply node and a word line;
   a second transistor electrically connected to a second voltage supply node and the word line;
   a first switch electrically connected to the first voltage supply node and a bulk electrode of the second transistor; and
   a second switch electrically connected to the second voltage supply node and the bulk electrode of the second transistor.

2. The word line driver of claim 1, further comprising:
   a negative pump electrically connected to a gate electrode of the second transistor.

3. The word line driver of claim 2, wherein the negative pump comprises:
   a logic gate having an input terminal and an output terminal;
   a capacitor having a first terminal electrically connected to the input terminal, and a second terminal electrically connected to the gate electrode of the second transistor; and
   a third transistor electrically connected to the second terminal of the capacitor and a third voltage supply node.

4. The word line driver of claim 3, wherein the negative pump comprises:
   a fourth transistor electrically connected to the second terminal of the capacitor and the third voltage supply node;
   a fifth transistor electrically connected to the second voltage supply node and a gate electrode of the fourth transistor; and
   a sixth transistor electrically connected to the second terminal of the capacitor and the gate electrode of the fourth transistor.

5. The word line driver of claim 1, further comprising a third switch electrically connected to the bulk electrode of the second transistor and the word line.

6. The word line driver of claim 5, further comprising:
a negative pump electrically connected to a gate electrode of the second transistor.

7. The word line driver of claim 6, wherein the negative pump comprises:
a logic gate having an input terminal and an output terminal;
a capacitor having a first terminal electrically connected to the input terminal, and a second terminal electrically connected to the gate electrode of the second transistor; and
a third transistor electrically connected to the second terminal of the capacitor and a third voltage supply node.

8. The word line driver of claim 7, wherein the negative pump comprises:
a fourth transistor electrically connected to the second terminal of the capacitor and the third voltage supply node;
a fifth transistor electrically connected to the second voltage supply node and a gate electrode of the fourth transistor; and
a sixth transistor electrically connected to the second terminal of the capacitor and the gate electrode of the fourth transistor.

9. A word line driver comprising:
a first transistor electrically connected to a first voltage supply node and a word line;
a second transistor electrically connected to a second voltage supply node and the word line;
a first switch electrically connected to the first voltage supply node and a bulk electrode of the second transistor; and
a second switch electrically connected to the bulk electrode of the second transistor and the word line.

10. The word line driver of claim 9, further comprising:
a negative pump electrically connected to a gate electrode of the second transistor.

11. The word line driver of claim 10, wherein the negative pump comprises:
a logic gate having an input terminal and an output terminal;
a capacitor having a first terminal electrically connected to the input terminal, and a second terminal electrically connected to the gate electrode of the second transistor; and
a third transistor electrically connected to the second terminal of the capacitor and a third voltage supply node.

12. The word line driver of claim 11, wherein the negative pump comprises:
a fourth transistor electrically connected to the second terminal of the capacitor and the third voltage supply node;
a fifth transistor electrically connected to the second voltage supply node and a gate electrode of the fourth transistor; and
a sixth transistor electrically connected to the second terminal of the capacitor and the gate electrode of the fourth transistor.

13. A method of driving a word line, comprising:
providing a first transistor electrically connected to a first voltage source and the word line;
providing a second transistor electrically connected to a second voltage source and the word line;
electrically connecting a bulk electrode of the second transistor to the first voltage source during a non-read period; and
electrically connecting the bulk electrode of the second transistor to the second voltage source around a beginning of a read period.

14. The method of claim 13, further comprising:
lowering gate voltage of the second transistor by a negative charge pump.

15. The method of claim 14, wherein lowering the gate voltage of the second transistor by the negative charge pump comprises:
receiving an input pulse at a first input terminal of a logic gate of the negative charge pump;
inverting the input pulse to generate an inverted input pulse; and
pulling down the gate voltage through capacitive coupling of a capacitor receiving the inverted input pulse.

16. The method of claim 15, wherein the logic gate is a NAND gate, and lowering gate voltage of the second transistor by the negative charge pump further comprises:
receiving a read signal at a second input terminal of the logic gate.

17. The method of claim 13, further comprising:
disconnecting the bulk electrode of the second transistor from the first voltage source around the beginning of the read period.

18. The method of claim 17, further comprising:
lowering gate voltage of the second transistor by a negative charge pump.

19. The method of claim 13, further comprising
electrically connecting the bulk electrode of the second transistor to the word line around the beginning of the read period.

20. The method of claim 13, further comprising:
lowering gate voltage of the second transistor by a negative charge pump.

* * * * *